US008580128B2

(12) United States Patent
Watanabe et al.

(10) Patent No.: US 8,580,128 B2
(45) Date of Patent: Nov. 12, 2013

(54) METHOD OF MANUFACTURING ELECTROMAGNETIC-WAVE SHIELDING PLATE, ELECTROMAGNETIC-WAVE SHIELDING PLATE MANUFACTURED THEREBY, AND FILTER DISPLAY USING THE SAME (75) Inventors: Osamu Watanabe, Kusatsu (JP); Tadashi Yoshioka, Otsu (JP); Kazuki Goto, Otsu (JP); Takayoshi Ueba, Uji (JP)

(73) Assignee: Toray Industries, Inc., Tokyo (JP)

( * ) Notice: Subject to any disclaimer, the term of this patent is extended or adjusted under 35 U.S.C. 154(b) by 1451 days.

(21) Appl. No.: 11/922,461

(22) PCT Filed: Jun. 14, 2006

(86) PCT No.: PCT/JP2006/311898
§ 371 (c)(1),
(2), (4) Date: Dec. 19, 2007

(87) PCT Pub. No.: WO2006/137299
PCT Pub. Date: Dec. 28, 2006

(65) Prior Publication Data
US 2009/0029127 A1    Jan. 29, 2009

(30) Foreign Application Priority Data
Jun. 20, 2005    (JP) .................................. 2005-179050

(51) Int. Cl.
*B44C 1/22* (2006.01)
(52) U.S. Cl.
USPC ................... 216/41; 216/49; 216/56; 216/83; 216/100; 438/745; 134/1; 134/2

(58) Field of Classification Search
USPC ......... 216/41, 49, 52, 53, 54, 83, 96, 100, 24, 216/56; 148/51; 134/1, 2; 438/745
See application file for complete search history.

(56) References Cited

U.S. PATENT DOCUMENTS

| 5,200,025 A * | 4/1993 | Toei et al. ...................... 216/12 |
| 5,529,831 A * | 6/1996 | Waga et al. .................... 428/209 |
| 6,589,870 B1 * | 7/2003 | Katoh ............................ 438/690 |
| 6,875,288 B2 * | 4/2005 | Gotoh et al. .................... 134/34 |
| 2003/0094296 A1 * | 5/2003 | Kojima et al. ............ 174/35 MS |
| 2006/0127690 A1 * | 6/2006 | Ueda et al. ..................... 428/596 |

FOREIGN PATENT DOCUMENTS

| JP | 62-7877 A | 1/1987 |
| JP | 9-293989 A | 11/1997 |
| JP | 10-041682 | * 2/1998 |
| JP | 11-31896 A | 2/1999 |

(Continued)

*Primary Examiner* — Shamim Ahmed
(74) *Attorney, Agent, or Firm* — Birch, Stewart, Kolasch & Birch, LLP (57) ABSTRACT

To provide an electromagnetic-wave shielding plate superior in an electromagnetic-wave shielding property, a light-transmitting property and non-visibility of a mesh pattern at low cost. A pattern of a resin layer is printed on a metal layer of a transparent substrate by a printing method. After that, the metal layer is over-etched with the resin layer used as an etching mask, and a part of the resin layer protruding from the remaining metal layer in a plate-surface direction is removed. As a result, an electromagnetic-wave shielding plate superior in an electromagnetic-wave shielding property and non-visibility and having, for example, a pattern line width of 3 μm or more and 25 μm or less.

3 Claims, 4 Drawing Sheets

(56) References Cited

FOREIGN PATENT DOCUMENTS

| | | |
|---|---|---|
| JP | 11-186785 A | 7/1999 |
| JP | 11-220287 A | 8/1999 |
| JP | 2000-137441 A | 5/2000 |
| JP | 2000-315888 A | 11/2000 |
| JP | 2000-315890 A | 11/2000 |
| JP | 2000-323889 A | 11/2000 |
| JP | 3388682 B2 | 1/2003 |
| JP | 2004-288800 A | 10/2004 |

* cited by examiner

Fig. 1

Conventional Art

METHOD OF MANUFACTURING ELECTROMAGNETIC-WAVE SHIELDING PLATE, ELECTROMAGNETIC-WAVE SHIELDING PLATE MANUFACTURED THEREBY, AND FILTER DISPLAY USING THE SAME

FIELD OF THE INVENTION

The present invention relates to an electromagnetic-wave shielding plate transparently visible and used for an image display unit, or the like, which generates an electromagnetic wave, such as a plasma display panel (PDP) and a cathode ray tube (CRT), a method of manufacturing the electromagnetic-wave shielding plate, and a filter and a display in which the electromagnetic-wave shielding plate is used.

BACKGROUND OF THE INVENTION

In recent years, regulations imposed on an electromagnetic wave generated from an electric product have been increasingly strict due to radio disturbances inflicting various precision mechanical devices, measuring devices, and digital devices and adverse influences on human bodies. Therefore, the emission of an electromagnetic wave has been legally controlled, for example, by the VCCI (Voluntary Control Council for Interference by data processing equipment electronic office machine). In a PDP which emits a particularly strong electromagnetic wave from an image display unit out of the device, a light-transmitting electromagnetic-wave shielding plate is combined with a plate having another function, such as antireflection and near infrared ray shielding, and the resulting plate is directly bonded to the image display unit as a front-face filter or is bonded to a transparent substrate formed from glass, plastic, or the like, used for the front-face filter, and then the substrate is placed on the image display unit. Thus, the electromagnetic wave can be shielded so as to observe the regulation.

Figure 2:
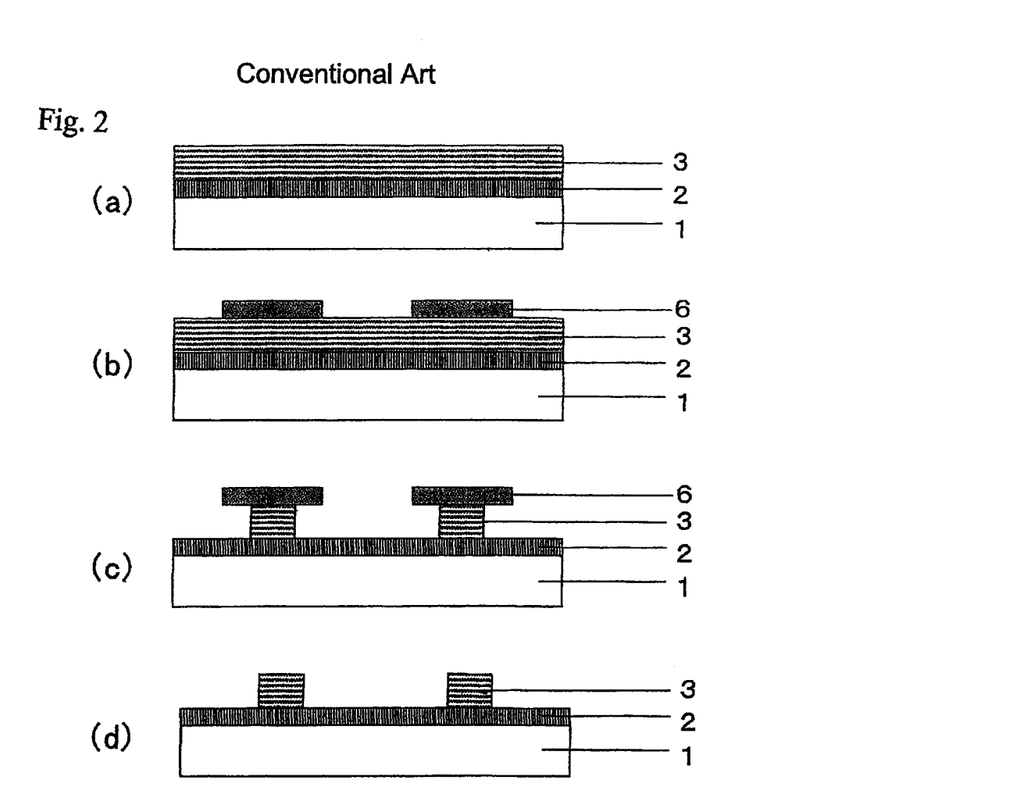
FIG. 2 shows a manufacturing process (schematic view) of a light-transmitting electromagnetic-wave shielding plate according to the conventional photolithography.

Conventionally, as the light-transmitting electromagnetic-wave shielding plate, a product is proposed, as shown in FIG. 2, in which a patterned conductive metal layer is provided on a transparent substrate 1 by photolithography (d), in such a manner that a metal layer 3, such as a copper foil, is laminated on the transparent substrate 1 with an adhesive layer 2 interposed therebetween (a), a resist film 6 is bonded thereto, and exposure, development (b), etching (c), and resist stripping is performed (d) (Patent Document 1).

As another method of forming the patterned conductive metal layer on the transparent substrate, a method has been proposed, in which an etching resist pattern is formed by a screen printing method or an offset printing method, the conductive metal layer is thereafter etched, and the resist is finally stripped (Patent Documents 2 and 3).

However, a photolithography method for manufacturing the light-transmitting electromagnetic-wave shielding plate using the conductive metal layer laminated on the transparent substrate can complete the formation of a thin-line pattern capable of having an electromagnetic-wave shielding property and a favorable light-transmitting property without any problem. On the other hand, it is necessary to use a copper foil whose one surface or both surfaces are subjected to black oxidation as the conductive metal layer in order to prevent the deterioration of an image quality such as contrast, and thus it is disadvantageously a factor for cost increase. Further, the photolithography includes complicated long processes, and therefore the photolithography can not satisfy cost reduction demanded by the market. There has been also proposed a process in which a black resist layer is laminated on the patterned conductive metal layer, and is not stripped but is left thereon in order to satisfy the electromagnetic-wave shielding property and the visibility of a display screen (Patent Document 4). This process, however, employs the photolithography after all, which also failed to satisfy the cost reduction demanded by the market.

In accordance with a method of forming an etching pattern of the light-transmitting electromagnetic-wave shielding plate by the screen printing method or the offset printing method, a simple device and process can be utilized, and the black resin layer is directly formed on the conductive metal layer having a metallic luster that impedes the contrast performance, and therefore a glittering impression can be controlled. Accordingly, the method can meet the cost reduction demanded by the market. However, in these printing methods, it is difficult to print a fine-pitch line width and to form a pattern with a thin-line of 20 µm or less, which is preferable in terms of the non-visibility of a mesh pattern. Further, the electromagnetic-wave shielding plate thereby obtained is not satisfactory in terms of the light-transmitting property.

Patent Document 1: Japanese Patent Publication No. 3388682
Patent Document 2: Japanese Unexamined Patent Publication No. 2000-315890
Patent Document 3: Japanese Unexamined Patent Publication No. 2000-323889
Patent Document 4: Japanese Unexamined Patent Publication No. H09-293989

DISCLOSURE OF THE INVENTION

Problem to be Solved by the Invention

An object of the present invention is to provide a method capable of manufacturing an electromagnetic-wave shielding plate superior in an electromagnetic-wave shielding property, a light-transmitting property and the non-visibility of a mesh pattern at low cost.

Means for Solving the Problem

In order to achieve the above-mentioned object, the present invention is characterized in the followings 1) to 6):
1) A method of manufacturing an electromagnetic-wave shielding plate in which a pattern of a resin layer is formed on a metal layer provided on one surface of a transparent substrate by a printing method, the metal layer is etched with the resin layer used as an etching mask, and a part of the resin layer protruding from the remaining metal layer in a plate-surface direction is removed
2) The method of manufacturing the electromagnetic-wave shielding plate recited in 1), wherein the part of the resin layer protruding from the metal layer is removed by an adhesive member or supersonic wave
3) The method of manufacturing the electromagnetic-wave shielding plate recited in 2), wherein the transparent substrate is dipped in a liquid when the part of the resin layer protruding from the metal layer is removed by the supersonic wave
4) An electromagnetic-wave shielding plate manufactured by the method recited in any of 1) through 3)
5) A filter comprising the electromagnetic-wave shielding plate recited in 4) and an antireflection layer
6) A display comprising the filter recited in 5).

Effect of the Invention

Figure 1:
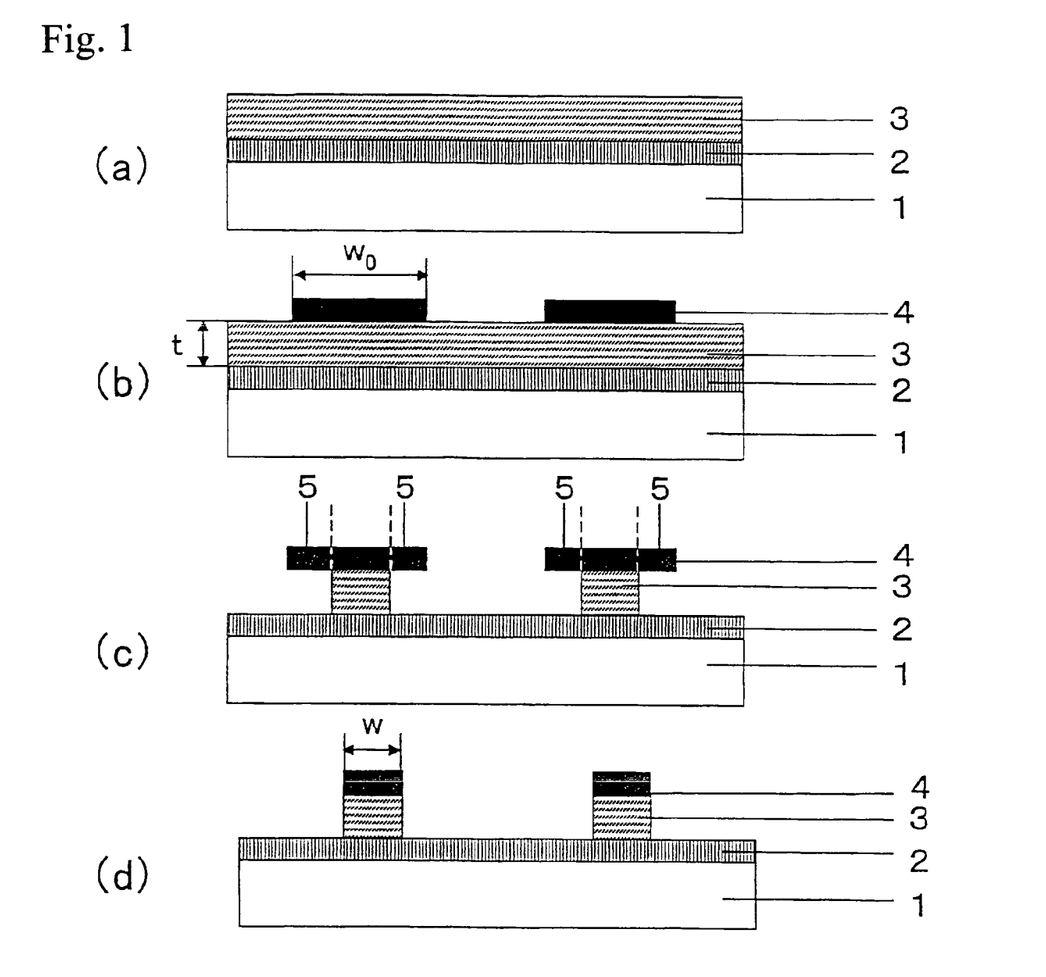
FIG. 1 is a view (schematic view) illustrating a manufacturing process of a light-transmitting electromagnetic-wave shielding plate according to an embodiment of the present invention.

According to the present invention, since a resin layer is laminated on a metal layer, which is thin-line patterned on a transparent substrate, an electromagnetic-wave shielding plate superior in an electromagnetic-wave shielding property and a light-transmitting property and capable of preventing the deterioration of an image quality such as contrast and moire can be provided. Further, according to the present invention, the pattern of a resin layer 4 is formed on the metal layer 3 provided on one surface of the transparent substrate 1 (a) by a printing method (b), the metal layer 3 is etched by chemical etching (c), and a part 5 of the resin layer 4 protruding from the remaining metal layer 3 in a plate-surface direction is removed (d) when the electromagnetic-wave shielding plate is formed as shown in FIG. 1. Therefore, a thin-line mesh pattern including the metal layer and the resin layer can be formed by the printing method, which is a low-cost method. As a result, the electromagnetic-wave shielding plate superior in the non-visibility of the mesh pattern can be obtained. Further, the formation of the resin layer on the metal layer makes it difficult to damage the surface of the transparent substrate on which the metal layer is not formed during manufacture. In addition, when the electromagnetic-wave shielding plate is bonded to any other material, the substrate can be hardly damaged.

Best Mode for Carrying Out the Invention

In a method of manufacturing an electromagnetic-wave shielding plate according to the present invention, a pattern of a resin layer is formed on a metal layer provided on one surface of a transparent substrate by a printing method, the metal layer is etched with the resin layer used as an etching mask, and a part of the resin layer protruding from the remaining metal layer in a plate-surface direction is removed. That is, the resin layer is etched under over-etching conditions so that the pattern of the metal layer having a line width thinner than that of the resin layer used as the etching mask can be obtained. After that, the part of the resin layer protruding from the remaining metal layer in the plate-surface direction is removed so that the line width of the resin layer can be equal to that of the metal layer. As a result, as shown in FIG. 1 (d), the electromagnetic-wave shielding plate thereby obtained has a thin-line pattern formed from the conductive metal layer 3 on the transparent substrate 1 (a line width w is, for example, 3 μm or more and 25 μm or less) and also has the thin-line pattern having the same line width formed from the resin layer 4 on the metal layer 3, and further, is superior in the non-visibility of the mesh pattern. In the conventional photolithography and printing method, it is necessary to strip an etching resist layer used as the mask during etching with a resist stripping liquid. In the present invention, it is only necessary to remove the part of the resin layer 4 protruding from the remaining metal layer 3 in the plate-surface direction, that is, it becomes basically unnecessary to remove any other part. Therefore, the electromagnetic-wave shielding plate superior in the electromagnetic-wave shielding property, light-transmitting property and non-visibility of the mesh pattern can be manufactured at low cost.

Examples of a material of the transparent substrate 1 include, but are not particularly limited to, glass, plastic, or the like. However, a plastic film which can be formed into a scroll shape is preferable from the viewpoint of handling. Examples of the plastic film include films obtained in such a manner that polyester-based resins such as polyethylene terephthalate (hereinafter, referred to as PET) and polyethylene naphthalate, acrylic resins, polycarbonate resins, polyolefin-based resins such as polypropylene, polyethylene, polybutene and polymethylpentene, cellulose-based resins such as triacetylcellulose and diacetylcellulose, polyvinyl-chloride-based resins, polyamide-based resins, polystyrene-based resins, polyurethane-based resins, polysulufone-based resins, polyether-based resins, polyacrylonitrile-based resins, or the like, are melted or dissolved and formed into a film. Among these films, a PET film is the most desirable in terms of transparency, heat resistance, chemical resistance, cost and the like.

As the transparent substrate 1, a single-layer film or a multilayered film including two layers or more, which is formed from one or a mixture of two or more of these plastic films can be used. A film having a total light transmittance of 85% or more may be preferably used as the transparent substrate 1.

The thickness of the transparent substrate 1 may be determined as to fit the application, and is not particularly limited. When an electromagnetic-wave shielding display according to the present invention is used as a general optical filter, the thickness is preferably 25 μm or more, and more preferably 50 μm or more. The upper limit of the thickness is preferably 250 μm or less, and more preferably 150 μm or less.

In order to provide the metal layer on the transparent substrate, the transparent substrate has to have a sufficient strength, and therefore the thickness is preferably 25 μm or more. Since the transparent substrate having a thickness of 50 μm or more tends to be tougher and increases workability in the process, the transparent substrate is preferable. In the case where the PET film having a thickness of less than 50 μm, or the like is used as the transparent substrate, another film such as a PET film capable of blocking a ultraviolet ray and/or an infrared ray or a hard-coat PET film may be laminated thereon so that the thickness can be increased.

On the other hand, the film is generally wound off from a roll and then used. For this reason, in the case where the film has a certain thickness or more, the film is not flat but is easily curled when it is wound off. Therefore, an additional step for making it flat is required. However, a film having a thickness of 250 μm or less can be used without such an additional step, then the film is preferable. Further, a film having a thickness of 150 μm or less is more preferable because a sufficient luminance can be easily obtained when used as a display, making it unnecessary to use an expensive substrate, such as a highly transparent PET film, as the transparent substrate.

Further, the transparent substrate 1 may be subjected to any publicly known adhesive treatment such as corona electrostatic discharge treatment, ozone treatment, plasma treatment or adhesive primer coating, if necessary, while or after forming the transparent substrate. For example, in the case where an adhesive treatment PET film which is commercially available is used, an additional adhesive treatment may not be performed.

As the conductive metal layer 3, one metal or an alloy or a multilayer composed of two or more of metals such as copper, aluminum, nickel, iron, gold, silver, stainless, chrome and titan. In terms of the conductivity in order to obtain the favorable electromagnetic-wave shielding property, easiness in the etching for the pattern processing, price, and the like, the one composed of copper or aluminum is preferable. Further, a treatment for controlling reflection due to the metallic luster is preferably applied in terms of the image quality of the display. In the case where copper is used for example, the black oxidation is preferably applied to at least one of the surfaces. In the case where aluminum is used for example, the anodization is preferably applied to at least one of the surfaces.

The thickness of the metal layer 3 is preferably 1 μm or more, and more preferably 5 μm or more. The upper limit of the thickness is preferably 30 μm or less, and more preferably 20 μm or less. When the thickness of the metal layer 3 is 1 μm or more, the line width of the pattern is narrowed so that the light-transmittance is increased, and yet, the effective electromagnetic-wave shielding property can be obtained. On the other hand, when the thickness of the metal layer 3 is 30 μm or less, the etching time can be reduced to achieve a higher efficiency, and the accuracy of the pattern can be increased at the same time. Further, the light transmittance when observed in the oblique perspective manner relative to the plate is high, and the display equipped with the metal layer 3 can have a wide view angle.

Examples of a method of forming the metal layer 3 on the transparent substrate 1 include the method of forming the metal layer 3, as shown in FIG. 1, in which the conductive metallic foil is bonded via the adhesive layer 2 (hereinafter, referred to as a metallic foil laminating method). One or in combination with two or more of thin film forming techniques, such as a vacuum deposition method, sputtering method, ion plate method, chemical vapor deposition method, and electroless/electrolytic plating method may be adopted, and the method is not particularly limited thereto. However, the metallic foil laminating method is preferable in terms of the manufacturing cost and easiness as the method of forming the metal layer 3 having any thickness of 1 μm or more as described.

An adhesive used in the metallic foil laminating method is not particularly limited; however, the one superior in the transparency, heat resistance, humidity resistance, adhesion, laminating suitability, easiness-to-handle and cost is preferably used. When a copper foil or an aluminum foil and the PET film are bonded to each other, a curing adhesive such as a urethane-based resin or an epoxy-based resin is preferably used, and a two-liquid curing adhesive including polyester polyol or polyether polyol as a base material and an isocyanate-based curing agent as a curing agent is more preferably used.

The pattern of the resin layer 4 used as the etching mask is formed on the metal layer 3 by the printing method. Any of the publicly known printing methods can be adopted as the printing method; however, the offset printing method and the screen printing method are preferably adopted in terms of the accuracy in printing dimensions (width, thickness) and easiness-to-control. Of the two methods, the offset printing method, in which tact time is short and an eco-friendly waterless plate is used, is more preferable.

Any product which is commercially available can be used as the waterless plate. Specific examples thereof include a positive plate and a negative plate in which a photo mask is used for exposure through the ultraviolet ray to form the pattern, and a CTP plate on which the rendering is directly performed on the plate with a laser. The negative plate and the CTP plate capable of printing the thin line are preferably used.

In the case of the offset printing, in particular, the printing may be performed at least twice in an overlapping manner in order to obtain a predetermined thickness of the resin layer 4.

The resin layer 4 is not particularly limited. However, a curing resin having a sufficient chemical resistance with respect to an etching solution corresponding to various types of metals constituting the metal layer 3 and having a good adhesion with respect to the metal layer 3 is preferably used as the resin layer 4. Further, a scintillation curing resin which is cured by the scintillation such as the ultraviolet ray or electronic beam is preferably used because the handling is excellent and it can be cured with a simple device.

As the scintillation curing resin can be used a resin composition in which various known monomers, oligomers, and prepolymers are appropriately selected and combined in terms of viscosity suitable for the printing and dispersibility of various additives such as a polymerization initiating agent, a polymerization stopping agent, a coloring agent, a dispersing agent, a leveling agent and a thixotropic agent. For example, a methacrylic-based composition or an acrylate-based resin composition can be mentioned.

In order to prevent the surface reflection due to the metallic luster of the metal layer 3, a coloring agent such as pigment or dye, and inorganic and/or organic particles are preferably added to the resin layer 4. The substance to be added is preferably black so that the image quality of the display or the like cannot be thereby affected. As a result of the measurement in which a spectrocolorimetric device CM-2500d manufactured by the KONIKA MINOLTA SENSING CO., LTD. (conditions of the optical system comply with the conditions c of the JIS Z8722 (1982)) and a light source of D65 are used, the substance which realizes $L^*$ of 40 or less is preferably used. As a black coloring agent, an inorganic pigment such as iron oxide, titan, or chrome oxide, an organic pigment such as carbon black, aniline black or perylene-based black, or a pigment which is turned into black when combined with the dye is preferably used. Further, three coloring agents of yellow, magenta and cyanogens may be mixed to generate black.

In order to easily obtain the grounding wire so that the electromagnetic-wave shielding property can be effectively obtained, the resin layer 4 may preferably include a conductive material such as metallic particles, conductive carbon particles, carbon nanotubes or conductive high molecules.

The thickness of the resin layer 4 is preferably 0.5 μm or more, and more preferably 1 μm or more. Further, the thickness is preferably 10 μm or less, and more preferably 6 μm or less. When the thickness is 0.5 μm or more, the function as the mask can be surely exerted when the metal layer is etched. Further, when the thickness is 10 μm or less, the resin layer 5 protruding from the remaining metal layer in the plate-surface direction (part of the resin layer protruding after a resin layer is side-etched) can be easily removed after the etching.

In the present invention, the mesh pattern denotes a figure formed with the metal layer and the resin layer present in the region of the electromagnetic-wave shielding plate finally obtained, which transmits light.

The shape of the mesh pattern finally formed on the electromagnetic-wave shielding plate is not particularly limited as far as it is such a shape that sufficiently secures the conduction with respect to a peripheral part of the plate. An example of the shape is a geometric shape, and an open-area ratio is preferably 70% or more, and more preferably 80% or more in order to increase the light transmittance and the luminance of the display. In terms of the electromagnetic-wave shielding property, the open-area ratio is preferably 95% or less, and more preferably 90% or less.

The shape of the open area in the mesh pattern is preferably an arbitrary shape in accordance with a specification of the display. Examples of the shape include triangles such as equilateral triangle, isosceles triangle and right-angled triangle formed by straight lines, tetragons such as square, rectangle, rhomboid, parallelogram and trapezoid, polygons such as hexagon, octagon and dodecagon, ring form such as circle, ellipse, and others formed with curved lines, and combination of these shapes. The shape of the open area is not necessarily an even or periodical shape across the entire surface of the plate, and may be an irregular shape. However, the open area is preferably any of the straight-lined shapes for the manufacturing process, and more preferably any of the triangles or tetragons. In the case of the open area formed by the straight lines, the resin protruding in the plate-surface direction can be easily removed.

The line width of the mesh pattern is preferably 3 μm or more in order to secure the continuity of the pattern. The line width is more preferably 25 μm or less in order to obtain a sufficient luminance of an image when used in the display. The line width is more preferably 5 μm or more and 15 μm or less so that the electromagnetic-wave shielding property is obtained, the moire can be prevented, and the image quality of the display such as the non-visibility can be improved.

In order to increase the electromagnetic-wave shielding property in the present invention, the pattern line of the metal layer is preferably not segmentalized but continued in the electromagnetic-wave shielding plate in the final stage. Therefore, the etching pattern of the resin layer provided by the printing preferably has such a shape that the line is not segmentalized but is continued.

In the electromagnetic-wave shielding plate, an outer peripheral part thereof generally does not demand the light transmittance. Therefore, the shape of the open area and the open-area ratio are not particularly limited in the outer peripheral part of the electromagnetic-wave shielding plate, and the outer peripheral part may have a flat pattern with no opening where it is easy obtain the grounding wire.

The resin layer 4 formed on the metal layer 3 may be removed when the conductivity is low in such a manner that is chemically melted and stripped with a stripping liquid or mechanically scraped in a peripheral part of the section connected to the grounding wire.

After the etching pattern of the resin layer 4 is printed on the metal layer 3, the metal layer 3 is etched with the resin layer 4 used as the mask layer. As an etching method, a dipping method using a publicly known etching liquid or a spray etching method using a spray nozzle or the like can be adopted in accordance with the metal layer 3. In the case where the conductive metal is copper, a ferric chloride solution, a cupric chloride solution and the like can be selected as the etching liquid. Further, in the case where the conductive metal is aluminum, a caustic soda solution and the like can be selected as the etching liquid. A publicly known additive such as a surface active agent or a precipitation stopping agent may be added to the etching liquid.

Before or after the metal layer 3 is etched, the metal layer 3 may be washed with water or the supersonic wave, subjected to a rust prevention treatment, air knife, heat-dry treatment or the like, if necessary. More specifically, in order to prevent the invasion of dust on the metal layer 3 into the etching liquid, the metal layer 3 may be washed with water or any dust thereon may be removed with the air knife before the etching. After the etching, the etching liquid attached to the plate may be washed away, or water drops remaining on the plate after the washing may be removed with the air knife or via the heat dry. Further, the rust prevention process may be applied after the etching in order to prevent the corrosion of the metal layer.

Figure 4:
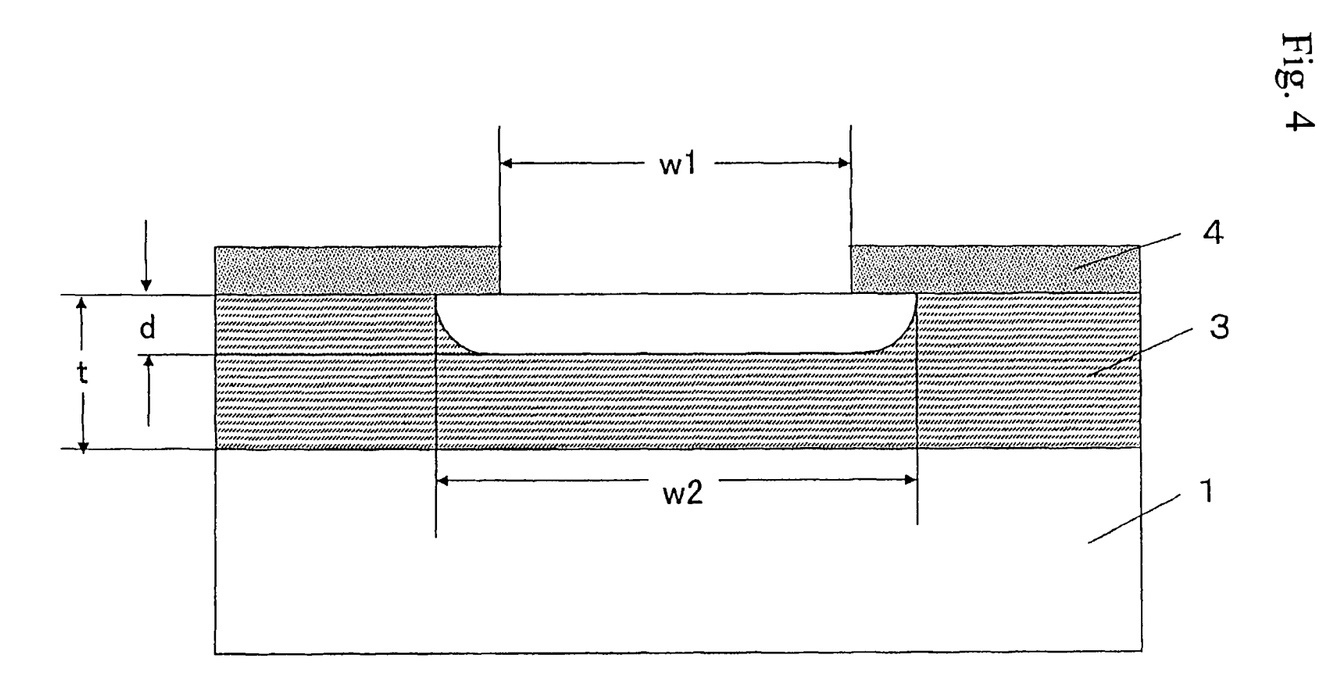
FIG. 4 is a schematic view illustrating side etching and etching factor during etching.

In the present invention, after the metal layer 3 is etched, the part of the resin layer protruding from the remaining metal layer in the plate-surface direction is removed. The etching of the metal layer 3 advances as follows though there are slight differences depending on the type of the metal and the types of the etching liquid and the etching method. The etching advances from the edge of the pattern of the printed resin layer 4 in the vertical direction and in the horizontal direction at the same time as shown in FIG. 4. Provided that the thickness of the etched metal layer 3 is d, the width of the exposed part of the metal layer 3 before the etching is w1, and the width of the exposed part of the metal layer 3 after the etching is w2, the following formulae are obtained.

$$\text{side etching amount } s=(w2-w1)/2 \quad (1)$$

$$\text{etching factor } ef=d/s=2d/(w2-w1) \quad (2)$$

The etching factor ef in the formula (2), which may depend on the type of the metal constituting the metal layer 3, composition of the etching liquid, etching conditions and etching depth (substantively corresponding to the thickness of the metal layer 3 in the present invention), is generally known to stay in the range of 1.0 to 3.0 (Metal Etching Technology by Toshikazu Sato, Maki Publishers, 1973, 78 pages). In the case where the etching factor is in the range of 1.0 to 3.0, the side etching amount s is 5 μm to 15 μm when the thickness t of the metal layer 3 is, for example, 15 μm. Therefore, in order to form the metal layer 3 having a thickness of 15 μm and the pattern-line width of 10 μm according to the present invention, the resin layer 4 having a pattern-line width of 20 to 40 μm is printed by the printing method and then etched, and the part of the resin layer 4 protruding from the remaining metal layer 3 in the plate-surface direction (resin layer 5 protruding from the side edge) is removed.

In the present invention, examples of a method of removing the part 5 of the resin layer 4 protruding from the remaining metal layer 3 in the plate-surface direction after the etching include a method in which the resin layer 5 is broken by the supersonic wave and removed after the etching and a method in which the resin layer 5 is transferred and adhered to an adhesive member such as an adhesive rubber roll, an adhesive roll, an adhesive plate, an adhesive tape or the like and then stripped. The former method is favorable in that it is unlikely to cause any damage to the transparent substrate such as scratches. In the case where the transparent substrate is dipped in a liquid such as a cleansing solution and the supersonic wave are applied thereto so that the resin layer 5 is broken, in particular, the resin layer is surely broken by the cavitation generated in the solution while the attenuation of the supersonic wave is prevented, and the reattachment of the broken resin layer with respect to the transparent substrate can be prevented. The latter method is favorable in that the device can be simplified and easily maintained. In particular, such a device that uses the adhesive roll in order to remove the adhesive rubber roll and the layer transferred to the adhesive rubber roll is easily maintained and, therefore, preferable. The latter method is preferably performed after water-washing and drying.

According to the present invention thus constituted, the ratio of the line width of the mesh pattern of the resin layer 4 to the line width of the mesh pattern of the metal layer 3 in the obtained electromagnetic-wave shielding plate can be 0.95 or more and 1.05 or less. As a result, the light-transmitting electromagnetic-wave shielding plate more superior in the light transmittance and non-visibility of the mesh pattern can be obtained. The line-width ratio of 0.95 or more is preferable since the deterioration of the image by the metal layer 3 is not recognized. The line-width ratio of 1.05 or less is preferable since the open-area ratio and the light transmittance are increased.

In order to break the resin layer 5 using the supersonic wave, a device having a supersonic-wave frequency of 16 kHz or more can be used. However, the frequency of the supersonic wave is preferably 25 kHz or more which is not included in the human minimum audible field and exerts a higher removal performance, and 50 kHz or less because too a high frequency results in the deterioration of the removal performance. Further, a frequency as close to 25 kHz as possible in the range of 25 to 50 kHz, which can reduce an irregularity in the removal performance, is more preferable.

In the case where the supersonic wave is applied so as to break the resin layer 5 in the state where the transparent substrate is dipped in the liquid such as the cleansing water, a distance between the specimen and a supersonic-wave transducer is substantially equal to a natural-number multiple of half a distance of the wavelength of the supersonic wave in the liquid. Therefore, in the case where the frequency of the supersonic wave is 25 kHz and the processing is performed in the liquid, the distance between the specimen and the supersonic-wave transducer is preferably 25 to 30 mm or 55 to 60 mm, and 30 mm thereafter. In the case of any distance other than the mentioned options, the removal performance is reduced, and any part which cannot be removed easily remains as the irregularity. An optimum value of the distance between the specimen and the supersonic-wave transducer is decided by the frequency of the supersonic wave and the sound velocity thereof in the liquid, and a range of the optimum values can be expanded when the supersonic waves of a plurality of frequencies are combined.

A distance between the supersonic-wave transducer and a liquid surface is preferably substantially (a natural-multiple number of half a distance of the wavelength of the supersonic wave in the liquid)+(distance of a quarter of the wavelength in the liquid).

In the case where a plurality of transducers is used in the processing, it is important how the transducers are placed in order to reduce the irregularity in the removal. More specifically, the electromagnetic-wave shielding plate is conventionally continuously manufactured in such a manner that the transparent substrate and the like is being fed, and the plurality of transducers is preferably placed at certain intervals in a direction orthogonally intersecting with the feeding direction (hereinafter, referred to as orthogonally-intersecting direction). For example, in the case where Langevin type transducer having a diameter of 4 mm (maximum output is 50 W) are used, the transducers are preferably placed so that an interval between the two transducers in the orthogonally-intersecting direction is 30 mm or less. When the interval is 30 mm or less, the possible deterioration of the removal performance in the part between the transducers can be prevented. In the case where it is difficult to set the interval between the two transducers in the orthogonally-intersecting direction to 30 mm or less, the positions of the transducers in the feeding direction can be shifted, or a case in which the plurality of transducers is provided can be tilted in the plate-feeding direction. Accordingly, the interval between the transducers in the orthogonally-intersecting direction can be reduced, and for example, can be 30 mm or less. As a result, the plate in which the removal irregularity is reduced can be manufactured. In the case of the sheet-feed type, the plate can be moved relative to the transducers, or the transducers can be moved relative to the plate.

The electromagnetic-wave shielding plate according to the present invention thus manufactured is suitably provided in a filter placed on a plasma display or the like together with an antireflection layer.

In the display, a PDP, a filter, a power-supply circuit, a circuit for converting a video signal into an electrical signal in compliance with the PDP, and the like, are housed in a case, and a positional relationship between the PDP and the filter is as described later. The case of the display can be further provided with a speaker for generating sound and voice, a driving circuit of the speaker, a television electric-wave receiving circuit, and the like.

The filter comprising the electromagnetic-wave shielding plate according to the present invention is generally mounted to a panel constituting the plasma display (hereinafter, referred to as PDP) according to the following two embodiments. The electromagnetic-wave shielding plate is directly bonded to a front-surface glass plate of the PDP in one of the embodiment, and the electromagnetic-wave shielding plate is bonded to a glass substrate separately prepared, and the plate bonded thereto is placed in front of the PDP with a small gap therebetween in the other. The electromagnetic-wave shielding plate according to the present invention is preferably used in the former embodiment.

The filter is constituted as follows in the respective embodiment. In the former embodiment, there are provided, from the PDP side, an impact absorption layer, the electromagnetic-wave shielding plate (transparent substrate on the PDP side), a color adjustment layer, a near infrared-ray absorption layer, and an antireflection layer. In the latter embodiment, there are provided the electromagnetic-wave shielding plate (resin layer having a pattern on the PDP side), glass, color adjustment layer, near infrared-ray layer and antireflection layer.

There may be independent and different layers which exert the respective functions, or one layer may exert the plurality of functions. There is not any particular limitation to the number of the layers, however, the following constitutions and compositions can be adopted.

The antireflection layer comprises two or more layers which are a low-refractive index layer and a high-refractive index layer, wherein the high-refractive index layer is placed on the PDP side. A silane coupling agent or fluororesin having an alkoxysilyl group can be used to form the low-refractive index layer. Acrylic resin including metallic compound particles can be used to form the high-refractive index layer. The combination use of the metallic compound particles can obtain the antistatic effect, which is preferable because the adherence of dust to the filter can be prevented. Each resin may be solved in a conventional organic solvent and applied to the electromagnetic-wave shielding plate or a substrate separately prepared.

The near infrared-ray absorption layer can be obtained when a coloring mater capable of absorbing the near infrared ray, such as a diimmonium-based compound, is applied to the transparent substrate of the electromagnetic-wave shielding plate or a substrate separately prepared. In the case where a phthalocyanine-based compound, a cyanine-based compound or a dithiol nickel complex compound is additionally used at the time, an absorbing performance can be preferably increased.

The color adjustment layer can be formed when a coloring agent capable of absorbing a visible beam having a wavelength of around 590 nm, such as a porphyrazine-based compound, is applied to the transparent substrate of the electromagnetic-wave shielding plate or a substrate separately prepared. The coloring agent may be used together with the coloring agent capable of absorbing the near infrared ray, and applied to the substrate by a conventional organic solvent together with a high-molecular resin binder.

EXAMPLES

The evaluation methods for the respective Examples and Comparative Examples will be described.
(1) Total Light Transmittance
The total light transmittance was measured with the turbidimeter NDH2000 manufactured by NIPPON DENSHOKU INDUSTRIES CO., LTD. based on the "Method of Testing Total Light Transmittance of Plastic Transparent Material", JIS K7361-1:1997. The total light transmittance was measured from the transparent-substrate side in the case of the electromagnetic-wave shielding plate, while the total light transmittance was measured from the side where the metal layer is not provided in the case of the transparent substrate. The measurement was performed at five points including four corners of the plate and the center of the plate, and an average value thereof was obtained. The total light transmittance of 70% or more is preferable.

(2) Line Widths and Open-Area Ratios of Etching Pattern and Mesh Pattern

The line width (μm) of the etching pattern of the printed resin layer, the line width (μm) and the open-area ratio (%) of the mesh pattern after the resin layer protruding from the remaining metal layer in the plate-surface direction after the etching was removed were measured based on a microscopic photograph. The line width and the open-area ratio were measured at five points including the four corners of the plate and the center of the plate three times at each of the points, and an average value of the 15 points was obtained.

Figure 3:
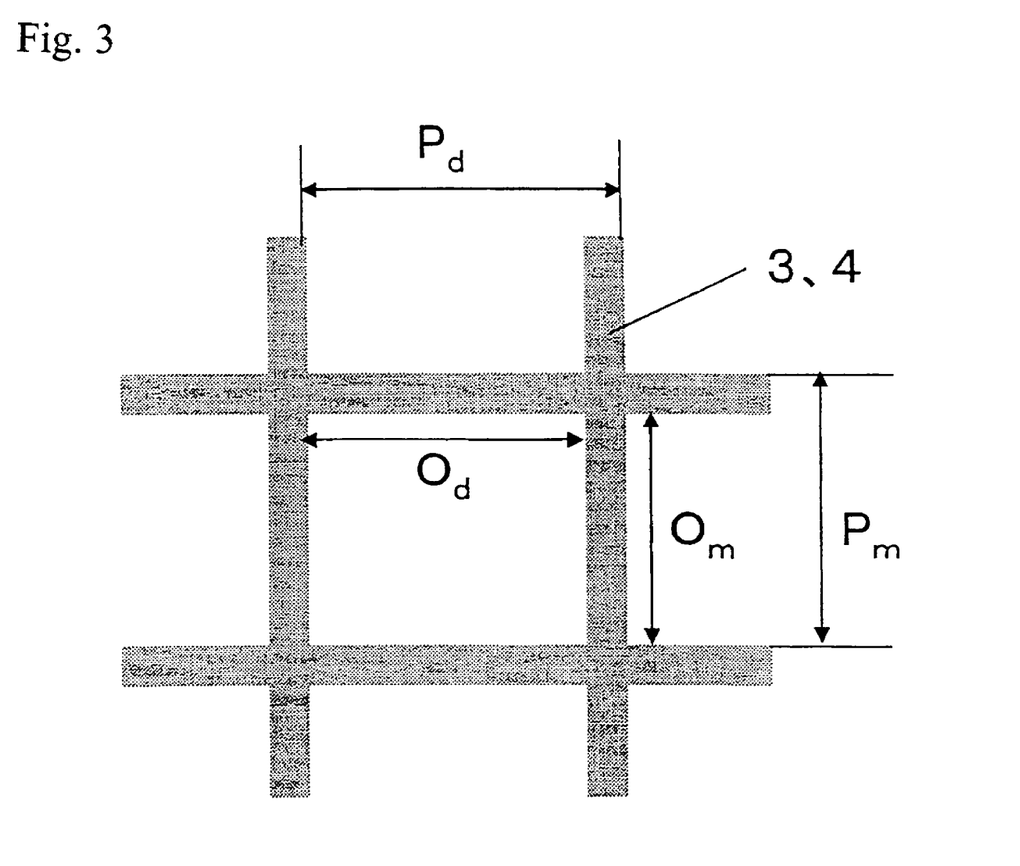
FIG. 3 is a schematic view of a mesh pattern of a light-transmitting electromagnetic-wave shielding plate obtained in Examples.

The open-area ratio rate (%) of the mesh pattern was calculated as follows:

$$\text{open-area ratio (\%)} = [(Om \times Od)/(Pm \times Pd)] \times 100$$

wherein the mesh pattern is as shown in FIG. 3, Pm (μm) and Pd (μm) are inter-grid pitches formed by the metal layer 3 and the resin layer 4, and Om (μm) and Op (μm) are the open-area widths of the pattern.

(3) Thickness of Resin Layer

A microtome was used to observe a sectional surface of the electromagnetic-wave shielding plate by a scan electronic microscope (manufactured by TOPCON CORPORATION, ABT-32, magnification of 2,500 times) so that the thickness of the resin layer was measured. The thickness was measured at five points including the four corners of the plate and the center of the plate three times at each of the points, and an average value of the 15 points was obtained.

(4) Thickness of Metal Layer

In the case where the metal layer was formed by a metallic foil laminating method, the conductive metallic foil itself before the laminating was measured through a micrometer, and the thickness of the metal layer (μm) was obtained. The thickness was measured at five points including the four corners of the plate and the center of the plate three times at each of the points, and an average value of the 15 points was obtained.

In the case where the metal layer was formed by means of, not a metallic foil laminating method, but a vacuum deposition method or an electroless/electrolytic plating method, or the measurement through the micrometer was not possible, a sectional surface of the metal layer was observed with the scan electronic microscope (manufactured by TOPCON CORPORATION, ABT-32, magnification of 2,500 times). The thickness was measured at five points including the four corners of the plate and the center of the plate three times at each of the points, and an average value of the 15 points was obtained as the thickness of the metal layer (μm).

(5) Electromagnetic-Wave Shielding Property

The shield evaluation device (TR 17031A), which was the spectrum analyzer system manufactured by ADVANTEST CORPORATION, and the KEC (Kansai Electronic Industry Development Center) method were adopted so that the attenuation of the electric-field wave (dB) and the attenuation of the magnetic-field wave (dB) in the frequency range of 10 MHz to 1 GHz were measured.

The shielding property is more superior as the values of the attenuation of the electric-field wave (dB) and the attenuation of the magnetic-field wave (dB) are larger. The evaluation standards (market demand) are as follows. When the attenuation of the electric-field wave and the attenuation of the magnetic-field wave both obtain "O", the electromagnetic-wave shielding property is favorable.

The attenuation of the electric-field wave: 40 dB or more: O, less than 40 dB: x The attenuation of the magnetic-field wave 15 dB or more: O, less than 15 dB: x (6) Non-Visibility The electromagnetic-wave shielding plate was observed in the place distant therefrom by 0.5 m with the fluorescent light in the room under the general conditions. The evaluation standards are as follows. "O" means that the non-visibility is favorable.

The geometric figure of the mesh pattern is unrecognizable
O

The geometric figure of the mesh pattern is recognizable x (7) Image Quality (Visibility of Display Screen)

The electromagnetic-wave shielding plate was bonded to the front-most surface of the PDP screen so that the resin layer was on the observation side, and visually observed from all of the directions such as front, from above, from beneath, right and left and the like and evaluated as follows. "O" means that the visibility is favorable.

The irregularity and glitter are not generated on the screen
O

The irregularity and glitter are generated on the screen x

Example 1

The copper foil having a thickness of 12 μm (manufactured by FURUKAWA CIRCUIT FOIL CO., LTD.) was laminated on the PET film having a total light transmittance of 93% and a thickness of 100 μm (manufactured by TORAY INDUSTRIES INC., "Lumirror" U34) as the metal layer via the two liquid type adhesive for a dry laminate (manufactured by Toyo-Morton, Ltd., base material AD-7P1/curing agent CAT-10L) so that a conductive metallic plate was prepared. Next, the waterless plate (negative type TAN24E manufactured by TORAY INDUSTRIES INC.) and the ultraviolet-ray curing ink (manufactured by T&K TOKA COMPANY, "Best Cure" UV171, black ink) were used so that the grid-shape pattern having a line width of 35 μm and a line pitch of 250 μm was printed twice on the copper-foil surface of the conductive metallic plate by the offset printing method (speed 5 m/min.) and the plate was thereafter UV-cured. As a result, the black resin layer having a grid shape and a thickness of 3 μm was formed. Next, the plate was etched for 1.5 minutes by spray etching with a ferric chloride solution temperature-adjusted in the range of 35 to 40° C. so that the copper foil in the part where the resin layer was not printed and below the line-width end part of the resin layer was removed. Then, the plate was washed with water and dried. Finally, the adhesive rubber roller (manufactured by TEKNEK Japan Limited., cleaning roller DCR, grade F) was used as the adhesive member so that the part of the black resin layer protruding from the remaining copper foil in the plate-surface direction was removed. As a result, the light-transmitting electromagnetic-wave shielding plate having a grid-shape mesh pattern (line width 11 μm, line pitch 250 μm, open-area ratio 90%) was obtained.

The total light transmittance, the electromagnetic-wave shielding property, the non-visibility and the image quality of the obtained light-transmitting electromagnetic-wave shield ing plate were evaluated by the methods (1), (5), (6), and (7), respectively.

A result thereby obtained is shown in Table 1.

Example 2

Copper was sputtered and electrolytic-plated on the PET film having a total light transmittance of 89% and a thickness of 38 μm (manufactured by TORAY INDUSTRIES INC., "Lumirror" T60) as the metal layer so that the conductive metallic plate having a thickness of 5 μm was prepared. Next, the grid-shape pattern having a line width of 17 μm and a line pitch of 250 μm was printed once on the copper-plated surface of the conductive metallic plate in a manner similar to that of Example 1, and the plate was thereafter UV-cured. As a result, the black resin layer having a grid shape having a thickness of 1.5 μm was formed. Next, the plate was etched for 0.8 minute by the spray etching with the ferric chloride solution temperature-adjusted in the range of 35 to 40° C. so that the copper in the part where the resin layer was not printed and below the line-width end part of the resin layer was removed. Then, the plate was washed with water and dried. Then, the part of the black resin layer protruding from the remaining copper in the plate-surface direction was removed in a manner similar to that of the Example 1. After that, the plate was bonded to the PET film having a total light transmittance of 92% and a thickness of 100 μm (manufactured by TORAY INDUSTRIES INC., "Lumirror" U426) with an acrylic adhesive. As a result, the light-transmitting electromagnetic-wave shielding plate having a grid-shape mesh pattern (line width 7 μm, line pitch 250 μm, and open-area ratio 95%) was obtained. The obtained light-transmitting electromagnetic-wave shielding plate was evaluated in a manner similar to Example 1.

A result thereby obtained is shown in Table 1.

Example 3

A conductive metallic plate was formed in a manner similar to Example 1 except that the PET film having a total light transmittance of 93% and a thickness of 125 μm was used in place of the PET film having a total light transmittance of 93% and a thickness of 100 μm, and the copper foil having a thickness of 10 μm (Nippon Denkai, Ltd.) was used in place of the copper foil having a thickness of 12 μm. On the copper-foil surface of the formed conductive metallic plate, the screen printing machine LS-150 manufactured by NEWLONG SEIMITSU KOGYO CO., LTD. and the two liquid type epoxy resin curing ink (manufactured by FUJIKURA KASEI CO., LTD., "Dotite" SH-3A) were used so that the lattice-shape pattern having a line width of 45 μm and the line pitch of 300 μm was printed once by the screen printing method (mesh #400, squeegee speed of 6m/min., squeegee angle of 70 degrees), and heat was applied thereto at 120° C. for 30 minutes. As a result, the black resin layer having a grid shape and a thickness of 8 μm was formed. After that, in a manner similar to that of the Example 1 except that the etching time was 1.7 minutes, the light-transmitting electromagnetic-wave shielding plate having a grid-shape mesh pattern (line width 23 μm, line pitch 300 μm, and open-area ratio 85%) was obtained. The obtained light-transmitting electromagnetic-wave shielding plate was evaluated in a manner similar to Example 1.

A result thereby obtained is shown in Table 1.

Example 4

The aluminum foil having a thickness of 15 μm (manufactured by Nippon Foil Mfg. Co., Ltd.) was laminated as the metal layer on the PET film having a total light transmittance of 92% and a thickness of 100 μm (manufactured by TORAY INDUSTRIES INC., "Lumirror" U426) as the metal layer via the two liquid type adhesive for the dry laminate (manufactured by DAINIPPON INK AND CHEMICALS, INCORPORATED, "DIC-DRY", base material LX-901/curing agent KW-75) so that a conductive metallic plate was prepared. Next, the grid-shape pattern having a line width of 45 μm and a line pitch of 300 μm was printed on the aluminum-foil surface of the conductive metallic plate by the screen printing method in a manner similar to Example 3. As a result, the black resin layer having a grid shape and a thickness of 8 μm was obtained. After that, the plate was etched for 3.5 minutes by the spray etching with the sodium hydroxide aqueous solution temperature-adjusted in the range of 45 to 50° C. so that the aluminum foil in the part where the resin layer was not printed and below the line-width end part of the resin layer was removed. After that, the part of the black resin layer protruding from the remaining aluminum foil in the plate-surface direction was washed away in the water with a plastic cleaning brush and then dried. As a result, the light-transmitting electromagnetic-wave shielding plate having a grid-shape conductive pattern (line width 15 μm, line pitch 300 μm, and open-area ratio 93%) was obtained. The obtained light-transmitting electromagnetic-wave shielding plate was evaluated in a manner similar to Example 1.

A result thereby obtained is shown in Table 1.

Example 5

A conductive metallic plate was prepared so that a black resin layer was formed in a manner similar to Example 1. The plate was etched so that the copper foil in the part where the resin layer was not printed and below the line-width end part of the resin layer was removed. Next, the part of the black resin layer protruding from the remaining copper foil in the plate-surface direction was washed away in the water with the supersonic wave, and then dried. As a result, the light-transmitting electromagnetic-wave shielding plate having a grid-shape conductive pattern (line width 11 μm, line pitch 250 μm, and open-area ratio 90%) was obtained.

In order to remove the resin using the supersonic waves, two ACATRON 600 manufactured by S&C Japan Co., Ltd., were placed as cleaning basins in the plate-feeding direction, and the interval between the transducers in the direction orthogonally intersecting with the feeding direction was 25 mm. The oscillation frequency of the supersonic wave was 25 kHz, the surfaces of the transducers were 70 mm deep below water, the feeding speed of the plate was 1.5 m/min., and the feeding position was 25 mm from the surfaces of the transducers.

The obtained light-transmitting electromagnetic-wave shielding plate was evaluated in a manner similar to Example 1.

A result thereby obtained is shown in Table 1.

Example 6

The light-transmitting electromagnetic-wave shielding plate was manufactured in a manner similar to Example 5 except that the feeding position of the plate was 40 mm from the surfaces of the transducers, and then evaluated.

A result thereby obtained is shown in Table 1.

Comparative Example 1

The light-transmitting electromagnetic-wave shielding plate was manufactured in a manner similar to Example 1 except that the part of the black resin layer protruding from the remaining copper foil in the plate-surface direction was not removed after the etching, and then evaluated in a manner similar to Example 1.

A result thereby obtained is shown in Table 1.

Comparative Example 2

The resin layer of the light-transmitting electromagnetic-wave shielding plate manufactured in a manner similar to Example 1 was completely removed with a polishing pad, and then, the evaluation was performed in a manner similar to Example 1. A result thereby obtained is shown in Table 1.

TABLE 1

| Item | | Example 1 | Example 2 | Example 3 | Example 4 | Example 5 | Example 6 | Comparative Example 1 | Comparative Example 2 |
|---|---|---|---|---|---|---|---|---|---|
| Transparent substrate | Material | PET | PET/PET | PET | PET | PET | PET | PET | PET |
| | Thickness (μm) | 100 | 38/100 | 125 | 100 | 100 | 100 | 100 | 100 |
| Conductive metal layer | Material | Copper foil | Copper plating | Copper foil | Aluminum foil | Copper foil | Copper foil | Copper foil | Copper foil |
| | Thickness (μm) | 12 | 5 | 10 | 15 | 12 | 12 | 12 | 12 |
| Resin layer | Material | UV ink | UV ink | Two-liquid curing | Two-liquid curing | UV ink | UV ink | UV ink | UV ink |
| | Thickness (μm) | 3 | 1.5 | 8 | 8 | 3 | 3 | 3 | 3 |
| Resin layer printing method | | Offset | Offset | Screen | Screen | Offset | Offset | Offset | Offset |
| Resin layer printing pattern | Line width (μm) | 35 | 17 | 45 | 45 | 35 | 35 | 35 | 35 |
| | Pitch (μm) | 250 | 250 | 300 | 300 | 250 | 250 | 250 | 250 |
| Electromagnetic-wave shielding plate | Line width (μm) | 11 | 7 | 23 | 15 | 11 | 13 | 35 | 11 |
| | Pitch (μm) | 250 | 250 | 300 | 300 | 250 | 250 | 250 | 250 |
| | Open-area ratio | 90 | 95 | 85 | 93 | 89 | 87 | 69 | 90 |
| Property | Total light transmittance | 83 | 81 | 78 | 84 | 82 | 80 | 62 | 83 |
| | Non-visibility | ○ | ○ | ○ | ○ | ○ | ○ | x | x |
| | Image quality | ○ | ○ | ○ | ○ | ○ | ○ | ○ | x |
| | Electromagnetic-wave shielding property Electric field/ magnetic field | ○/○ | ○/○ | ○/○ | ○/○ | ○/○ | ○/○ | ○/○ | ○/○ |

Examples 1 to 6 satisfy all the "light transmittance", "electromagnetic-wave shielding property", "non-visibility" and "no deterioration of the image quality" which were demanded by the market. In Example 6, though there is no difference in the electromagnetic-wave shielding property, non-visibility of the mesh pattern and the image quality, a very small portion of the part of the resin layer protruding from the metal layer, which could not be completely removed, is confirmed. In Comparative Example 1, the line width of the conductive pattern is extended, and the grid-shape pattern is visually confirmed because the black resin layer protruding from the remaining copper foil in the plate-surface direction after the etching is not removed. In Comparative Example 2, the luster of the metal layer is visually confirmed, and the non-visibility of the mesh pattern is deteriorated. Further, the original color tone of the image could not be reproduced because the color tone of the image is changed by the color tone of the copper foil.

INDUSTRIAL APPLICABILITY

The electromagnetic-wave shielding plate according to the present invention is applicable as a plate for blocking an electromagnetic wave in a display unit or the like such as a plasma display panel (PDP), a cathode-ray tube (CRT), or the like, which generates the electromagnetic wave.

DESCRIPTION OF REFERENCE SYMBOLS 1. transparent substrate
2. adhesive layer (or surface processing layer of the transparent substrate)
3. metal layer
4. resin layer formed by printing method
5. resin layer protruding from remaining metal layer in plate-surface direction after etching
6. resist film

The invention claimed is:

1. A method of manufacturing an electromagnetic-wave shielding plate which comprises:
   forming a pattern of a resin layer on a metal layer provided on one surface of a transparent substrate by a printing method;
   etching the metal layer with the resin layer used as an etching mask so as to leave a remaining metal layer under the resin layer with the resin layer including a protruding portion that protrudes outside the boundary of the metal layer in a plate-surface direction; and
   removing only the protruding portion of the resin layer by adhering the protruding portion to an adhesive member, or by dipping the transparent substrate in a liquid and subjecting the protruding portion of the resin layer to a supersonic wave so that the protruding portion is removed by cavitation generated by the supersonic wave in the liquid.

2. The method of manufacturing an electromagnetic-wave shielding plate according to claim 1, wherein the transparent substrate has a thickness of 25 μm to 250 μm, the metal layer has a thickness of 1 μm to 30 μm, and the resin layer has a thickness of 0.5 μm to 10 μm.

3. The method of manufacturing an electromagnetic-wave shielding plate according to claim 1, wherein the transparent substrate is glass or plastic; the metal layer is one metal, an alloy, or a multi-layer composed of two or more metals; and the resin layer is a scintillation curing resin.

* * * * *